(12) United States Patent
Carpaij et al.

(10) Patent No.: US 6,960,775 B1
(45) Date of Patent: Nov. 1, 2005

(54) LITHOGRAPHIC APPARATUS, DEVICE MANUFACTURING METHOD AND DEVICE MANUFACTURED THEREBY

(75) Inventors: Rene Hubert Jacobus Carpaij, Vught (NL); Hans Van Der Laan, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/822,865

(22) Filed: Apr. 13, 2004

(51) Int. Cl.⁷ .......................... G03F 7/20; G03F 9/00; H01J 37/302; H01J 37/08; G21K 5/10

(52) U.S. Cl. .................. 250/492.22; 250/492.1; 250/492.2; 250/492.23; 250/492.3; 430/394

(58) Field of Search .................... 250/492.1, 492.2, 250/492.3, 492.22, 492.23; 347/224, 228, 347/239, 240, 246, 251, 253; 430/5, 30, 313, 430/323, 394, 395; 356/237.1–2, 237.4, 394; 382/144; 358/3.01

(56) References Cited

U.S. PATENT DOCUMENTS

| | | | |
|---|---|---|---|
| 5,965,306 A * | 10/1999 | Mansfield et al. | 430/22 |
| 6,132,940 A * | 10/2000 | Mih et al. | 430/394 |
| 6,404,499 B1 * | 6/2002 | Stoeldraijer et al. | 356/400 |
| 6,526,164 B1 * | 2/2003 | Mansfield et al. | 382/144 |
| 6,534,221 B2 * | 3/2003 | Lee et al. | 430/5 |
| 6,553,562 B2 * | 4/2003 | Capodieci et al. | 716/19 |
| 6,607,863 B2 * | 8/2003 | Irie | 430/30 |
| 6,627,378 B1 * | 9/2003 | Koh | 430/270.1 |
| 6,765,712 B2 * | 7/2004 | Van Dijsseldonk et al. | 359/291 |
| 6,777,140 B2 * | 8/2004 | Singh et al. | 430/5 |
| 6,809,809 B2 * | 10/2004 | Kinney et al. | 356/237.5 |
| 6,819,450 B1 * | 11/2004 | Jolley et al. | 358/1.8 |
| 6,864,041 B2 * | 3/2005 | Brown et al. | 430/316 |
| 2002/0164546 A1 * | 11/2002 | Brown et al. | 430/316 |
| 2003/0127607 A1 * | 7/2003 | Van Der Veen | 250/492.22 |
| 2003/0165749 A1 * | 9/2003 | Fritze et al. | 430/5 |
| 2003/0223050 A1 * | 12/2003 | Fritze et al. | 355/51 |
| 2004/0214094 A1 * | 10/2004 | Kim et al. | 430/5 |

* cited by examiner

Primary Examiner—John R. Lee
Assistant Examiner—Bernard E. Souw
(74) Attorney, Agent, or Firm—Pillsbury Winthrop Shaw Pittman LLP

(57) ABSTRACT

A device manufacturing method using lithographic apparatus, in which method a patterned beam of radiation is projected on to a target portion of a substrate. Prior to exposing the substrate to the patterned beam of radiation a beam of compensating radiation is irradiated on to a predetermined area of the substrate, the beam of compensating radiation having an intensity which varies across said predetermined area. In the described embodiment the beam of compensating radiation is applied to an annular edge region of the substrate and has an intensity which is tilted across the cross-section of the beam so as to increase or decrease in intensity towards the edge of the substrate. This is done to improve the critical dimension (CD) uniformity across the substrate.

22 Claims, 6 Drawing Sheets

After develop

After Etch

LITHOGRAPHIC APPARATUS, DEVICE MANUFACTURING METHOD AND DEVICE MANUFACTURED THEREBY

BACKGROUND OF THE INVENTION

1. Field of the Invention

The present invention relates to a lithographic apparatus, a device manufacturing method and a device manufactured thereby. In particular the invention concerns critical dimension (CD) profile correction in lithography.

2. Background to the Invention

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist) on it. In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

One problem encountered in lithography is that the critical dimension (CD), namely the width of a patterned line that can be printed (on the wafer) within design tolerances, varies across the wafer. Commonly the linewidth that can be printed within set design tolerances varies across the wafer, either increasing steeply or decreasing steeply at the edge of the wafer. We refer to this phenomenon as variation in the CD profile across the wafer and the pattern of this variation as the "CD fingerprint" of the wafer. This is caused by downstream process steps (e.g., etch, annealing) and commonly has the effect that, for a set of lines of uniform width to be printed on the wafer, the actual linewidth which is printed decreases or increases towards the edge of the wafer (whether the linewidth decreases or increases usually this depends on whether negative or positive resist is used on the wafer in the lithographic process). This is illustrated in FIG. 1 (which is a plan view of the critical dimension profile across a wafer) by the change in tonal shading towards the edge of the wafer. This results in a decrease in yield (i.e., less useable chips from each printed wafer) for the chip manufacturer.

One known technique to address this problem involves trying to compensate for the variation in CD profile at the edge of the wafer by using predetermined offsets in the dose (i.e., amount of exposure) applied to particular areas or "fields" on the wafer, usually to individual die at or near the edge of the wafer, when these fields are exposed with the pattern to be printed onto them. For example certain fields may be exposed with higher or lower energy doses of the patterned light being imaged onto the wafer (than would be used where no such "CD correction" technique is employed). However this has the disadvantage that the whole field has an offset applied to it. This results in an over-correction on one side of the field and under-correction on the other side.

Another problem issue is that in some cases the CD profile may in some cases be relatively flat across the wafer, but one or more device performance characteristics may vary in a plurality of devices formed at different positions across the wafer (where the plurality of devices were all designed to have the same said device performance characteristics).

SUMMARY OF THE INVENTION

According to one aspect of the invention there is provided lithographic apparatus including, a first illumination system for providing a projection beam of radiation, a support structure for supporting a patterning device, the patterning device serving to impart the projection beam with a pattern in its cross-section, a substrate table for holding a substrate, and a projection system for projecting the patterned beam onto a target portion of the substrate, wherein the apparatus further includes a second illumination system for providing a compensating beam of radiation to a predetermined area on the substrate and the intensity of the compensating beam varies across the predetermined area.

For the avoidance of doubt it will be understood that the beam intensity varies across the predetermined area in the sense that the beam has a non-uniform intensity distribution across the predetermined area. The intensity of the compensating beam may vary across the predetermined area in a manner so as to substantially compensate for variation in one or more predetermined device performance characteristics (for example, electrical characteristics) which would otherwise occur in a plurality of devices (for example chips) to be formed on the substrate. For example, the intensity of the compensating beam may vary across the predetermined area so as to vary the CD profile across the predetermined area in a manner so as to substantially compensate for variation in the one or more predetermined device performance characteristics across a plurality of devices to be formed in the predetermined area. In another possible embodiment, the intensity of the compensating beam varies across the predetermined area in a manner so as to substantially compensate for variation in the CD profile (which would otherwise occur) across the predetermined area. In this latter embodiment most preferably the predetermined area is an edge region of the substrate and the intensity of the compensating beam increases or decreases towards the edge of the substrate. It will be appreciated that whether or not the beam intensity increases or decreases will depend on whether the CD profile is expected to decrease or increase respectively towards the edge of the substrate (if the compensating beam were not applied). In a preferred embodiment the substrate is generally circular in shape and the intensity of the compensating beam may vary substantially linearly in a radial direction in relation to the substrate so as to increase or decrease towards the edge of the substrate.

In one embodiment the substrate table may be formed and arranged to rotate the substrate during exposure with the compensating beam so that an annular area of the substrate is exposed with the compensating beam. In this case the first and second illumination systems may conveniently be integrally provided in a common machine or common portion of the apparatus. Alternatively, a second substrate table may be provided for holding the substrate during exposure of the predetermined area of the substrate with the beam of compensating radiation. In this case the second illumination system and the second substrate table may conveniently be provided in a separate portion of the apparatus (for example, in a separate stand-alone machine) to the first illumination system, the support structure, and the projection system. For example, the illumination system for providing the beam of compensating radiation may conveniently be provided in the form of a modified Optical Edge Bead Removal (OEBR) tool or system. It will be appreciated that OEBR tools (as sold) are generally configured to provide a uniform intensity beam of light/radiation which is applied to an edge region of a wafer. However, such a tool may easily be modified by, for example, using an appropriate filter, so as to shape the intensity profile of the beam in the manner required in the present invention. Alternatively, the second illumination system may comprise any other type of apparatus capable of providing the required compensating beam, for example a laser system configured to provide a compensating beam having the required intensity profile in beam cross-section.

According to a further aspect of the invention, there is provided a device manufacturing method including, providing a substrate, providing a projection beam of radiation using an illumination system, using patterning device to impart the projection beam with a pattern in its cross-section, and projecting the patterned beam of radiation onto a target portion of the substrate, wherein before the patterned beam of radiation is projected on to the target portion of the substrate, a beam of compensating radiation is irradiated on to a predetermined area of the substrate, the beam of compensating radiation having an intensity which varies across the predetermined area.

The beam of compensating radiation may have an intensity which varies substantially linearly across the predetermined area. Alternatively the beam intensity may vary in any other manner required in order to substantially compensate for variation in a predetermined device performance characteristic across the predetermined area of the wafer, or to substantially compensate for variation in CD profile across the predetermined area (e.g., the intensity profile of the beam cross-section may vary in accordance with a linear or quadratic function, or may vary exponentially).

The predetermined area may be an edge portion of the substrate. The substrate may be substantially circular in shape and the intensity of the compensating beam may increase or decrease in a radial direction relative to the substrate so as to increase or decrease respectively towards the edge of the substrate. The method preferably further includes rotating the substrate during irradiation with the compensating beam so that an annular edge region of the substrate is irradiated with the compensating beam.

In one embodiment, the beam of compensating radiation may be provided by an Optical Edge Bead Removal (OEBR) tool or system adapted to provide a beam of radiation having a varying intensity in cross-section.

Irradiating the annular edge region of the substrate with the beam of compensating radiation, prior to projecting the patterned beam of radiation on to the substrate, means that a layer of photoresist present on the whole exposed surface of the substrate has extra energy applied to it in this edge region, compared with the rest of the substrate which is only irradiated with the subsequently projected patterned beam. Where the pattern projected on to the edge region of the substrate comprises a set of lines of uniform width, this results in a set of lines of non-uniform width on the substrate once the layer of resist on the substrate has been developed, but following a subsequent etch step to etch these developed lines in the substrate the etched lines are found to be more uniform in width. By selecting an appropriate level of intensity, and tilt in the intensity level across the physical span of the compensating beam, substantially uniform linewidth can be achieved in the etched lines in the edge region of the substrate.

Unlike in the prior art systems in which individual die on the substrate are irradiated each with a uniform offset energy level when the pattern to be written on those die is exposed on to those die, in the present invention the rotationally symmetrical nature of the CD variation at the edge region of the wafer (as seen in FIG. 1) is compensated in a complementary rotationally symmetric manner by pre-exposing the annular edge region of the substrate using a compensating beam of radiation which itself has a tilted (or otherwise appropriately shaped) intensity level, the tilt being such that the intensity increases (or decreases) towards the edge of the substrate. This results in better correction of the variation in critical dimension (CD) across the substrate.

According to a further aspect of the invention, there is provided a device manufactured according to the device manufacturing method according to the second aspect of the invention and/or by the lithographic apparatus according to the first aspect of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm).

The term "patterning device" used herein should be broadly interpreted as referring to device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination systems may also encompass various types of optical components, including refractive, reflective, and catadioptric optical components for directing, shaping, or controlling the projection beam of radiation, or the compensating beam, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. In this case, for example, the step of pre-exposing the predetermined area of the substrate with the beam of compensating radiation may be carried out on a substrate on one of the tables while the other table is being used to expose another substrate (this one having already been pre-exposed to the compensating beam) to the patterned projection beam.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Preferred embodiments of the invention will now be described by way of example only and with reference to the accompanying drawings in which.

DETAILED DESCRIPTION OF THE PREFERRED EMBODIMENTS

Figure 2:
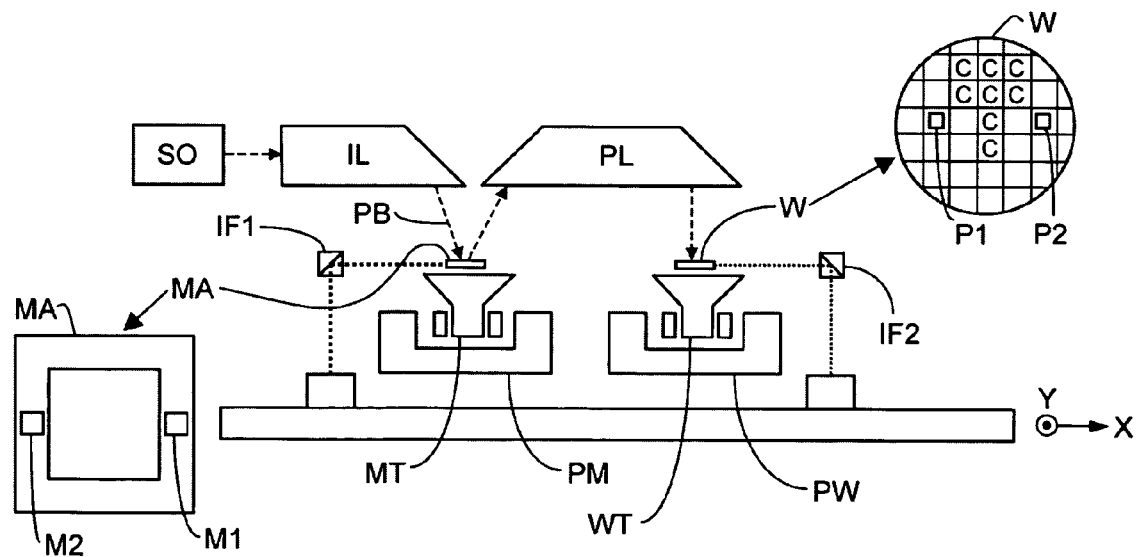
FIG. 2 depicts a typical lithographic apparatus of the reflective type.

FIG. 2 schematically depicts a lithographic apparatus according to one particular embodiment of the invention. The apparatus comprises:

- an illumination system (illuminator) IL for providing a projection beam PB of radiation (e.g., UV or EUV radiation).
- a first support structure (e.g., a mask table) MT for supporting patterning device (e.g., a mask) MA and connected to first positioning means PM for accurately positioning the patterning device with respect to item PL;
- a substrate table (e.g., a wafer table) WT for holding a substrate (e.g., a resist-coated wafer) W and connected to second positioning means PW for accurately positioning the substrate with respect to item PL; and
- a projection system (e.g., a reflective projection lens) PL for imaging a pattern imparted to the projection beam PB by patterning device MA onto a target portion C (e.g., comprising one or more dies) of the substrate W.

As here depicted, the apparatus is of a reflective type (e.g., employing a reflective mask or a programmable mirror array of a type as referred to above). Alternatively, the apparatus may be of a transmissive type (e.g., employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting means for adjusting the angular intensity distribution of the beam. Generally, at least the outer and/or inner radial extent (commonly referred to as R-outer and α-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning means PW and position sensor IF2 (e.g., an interferometric device), the substrate table WT can be moved accurately, e.g., so as to position different target portions C in the path of the beam PB. Similarly, the first positioning means PM and position sensor IF1 can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1:
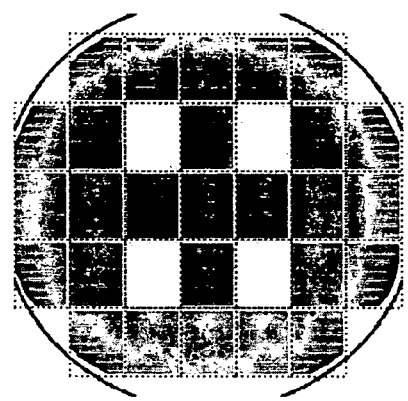
FIG. 1 depicts a critical dimension (CD) profile across a wafer.
Figure 3A:
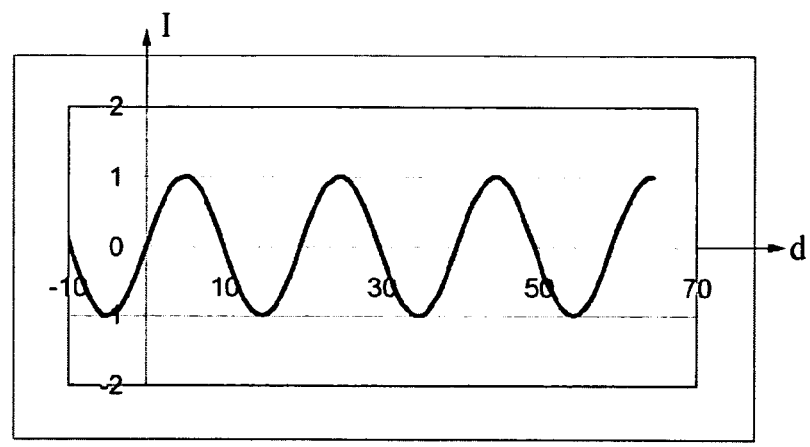
FIG. 3(a) is a graphical representation of an aerial intensity profile produced in a beam of radiation by a mask for printing a set of uniform lines (plotted as intensity (I) v. distance (d) in a linear direction in cross-section of the beam)
Figure 4:
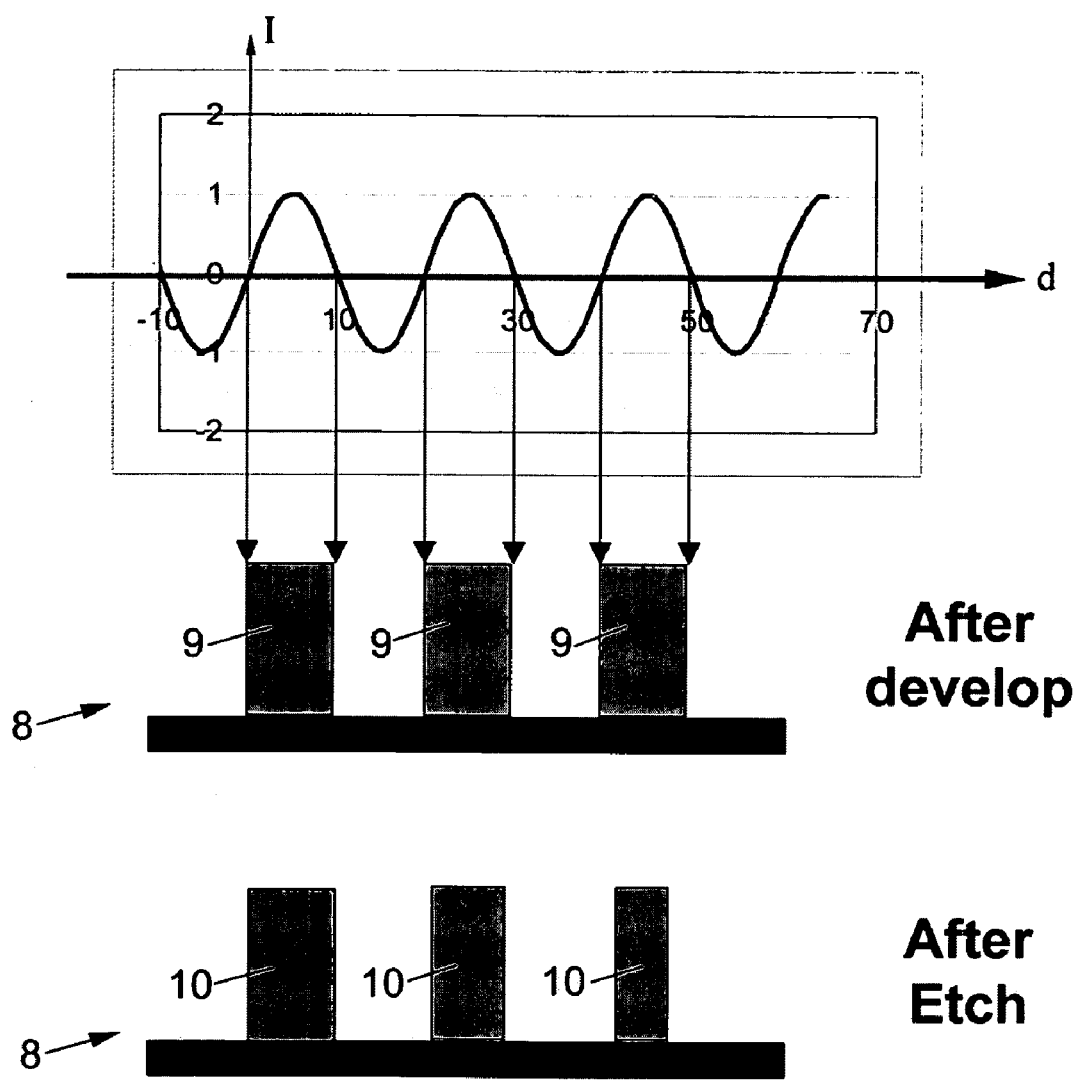
FIG. 4 illustrates the formation of non-uniform lines at a wafer edge region.

FIG. 3(a) illustrates graphically an aerial image formed by a projection beam having imparted onto it a pattern of uniformly spaced lines of uniform width. FIG. 4 illustrates what happens in practice when this aerial image is projected on to an annular wafer 8 to be patterned therewith. FIG. 3(a) shows the intensity distribution across the thus patterned portion of the cross-section of the projection beam. The projection beam patterns a layer of negative (photo)resist present on the exposed surface of the wafer 8 with the aerial image. After the thus patterned resist is developed using conventional development processes lines 9 of uniform width are found to be present throughout the area of the wafer exposed to the aerial image. In fact it is found that the critical dimension (CD) is more or less flat across the wafer, at this stage. However, when a subsequent necessary etch step is then carried out using conventional etching processes it is found that this results in non-uniform width lines 10 across the wafer 8. In particular, the linewidth decreases towards the edge of the wafer with a steep decrease in width being seen in an annular edge region of the wafer (this is also illustrated in FIG. 1).

Figure 3B:
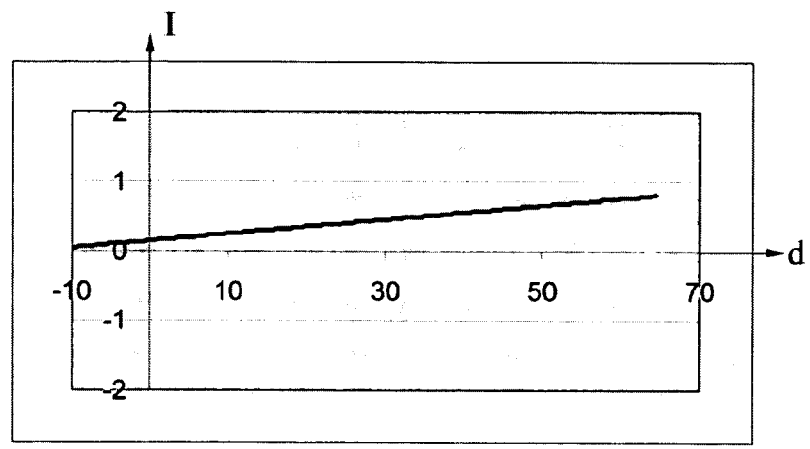
FIG. 3(b) is a graphical representation of the intensity profile of a tilted intensity beam (plotted as intensity (I) v. distance (d) in the same linear direction as FIG. 3(a), again in cross-section of the beam)
Figure 3C:
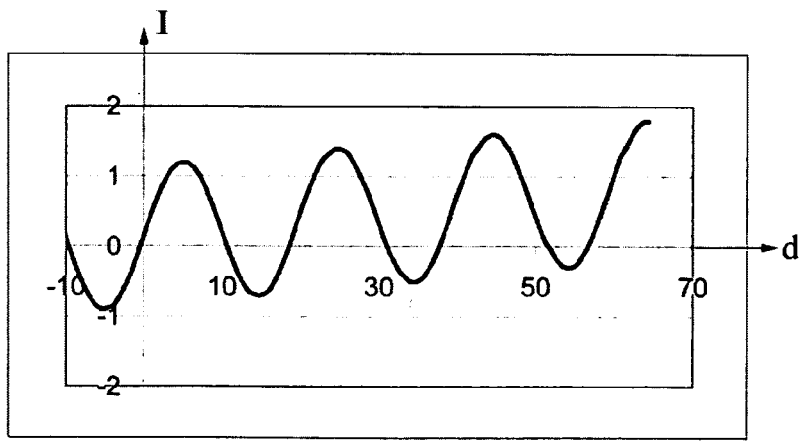
FIG. 3(c) is a graphical representation of the combination of the intensity profiles of FIGS. 3(a) and (b)
Figure 5:
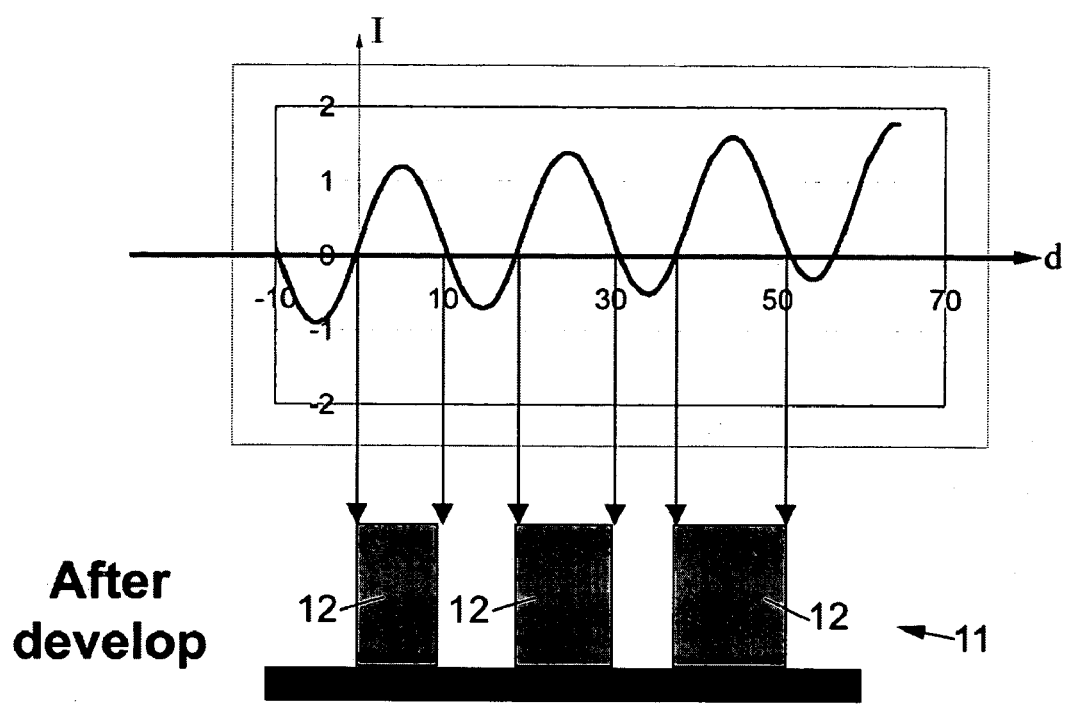
FIG. 5 illustrates an inventive process for forming uniform lines at a wafer edge region.

FIGS. 3(b) and (c) illustrate a solution to this problem. By adding a tilted intensity profile to the aerial image of FIG. 3(a) this produces a resulting combined aerial image of the pattern of lines in which the aerial image is tilted in intensity. FIG. 3(b) shows a tilted intensity beam in which the intensity increases linearly with distance (in the cross-section of the beam), in the same direction as the variation in intensity in the aerial image of FIG. 3(a). FIG. 3(c) shows the resulting tilted aerial image when the tilted intensity profile of FIG. 3(b) is combined with the aerial intensity profile of FIG. 3(a). In the present invention this tilt in the aerial image is achieved by pre-exposing the wafer, or more particularly a predetermined edge region of the wafer, with a beam of radiation (this shall be referred to as the "compensating beam") having such a tilted intensity and then carrying out the normal exposure of the wafer with the desired patterned projection beam (i.e., the desired aerial image). FIG. 5 illustrates the effect of this combined exposure technique on the uniformity of the linewidth of the resulting lines patterned on the wafer 11. By arranging the tilt in intensity such that the intensity is increasing towards the edge of the wafer 11, the tilt in intensity having a selected gradient, it is found that although lines 12 of non-uniform width are formed on the wafer 11 after the resist layer on the wafer is developed, after the etching step the resulting lines 13 are of uniform, or substantially uniform, linewidth. The exact gradient of tilt needed in the compensating beam of radiation can be determined empirically by experimentation but may be of the order of 3 to 5%. However it will be appreciated that the exact value will depend on the resist process steps used and also the etch process being used.

Figure 6:
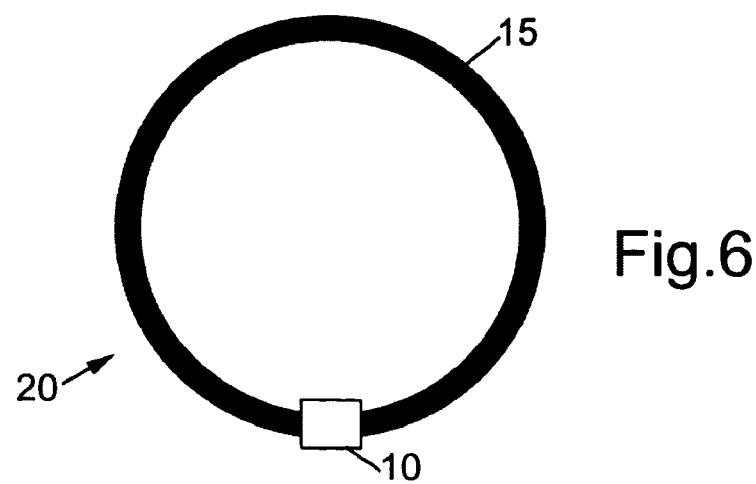
FIG. 6 illustrates a technique for carrying out the inventive process illustrated in FIG. 4.
Figure 7:
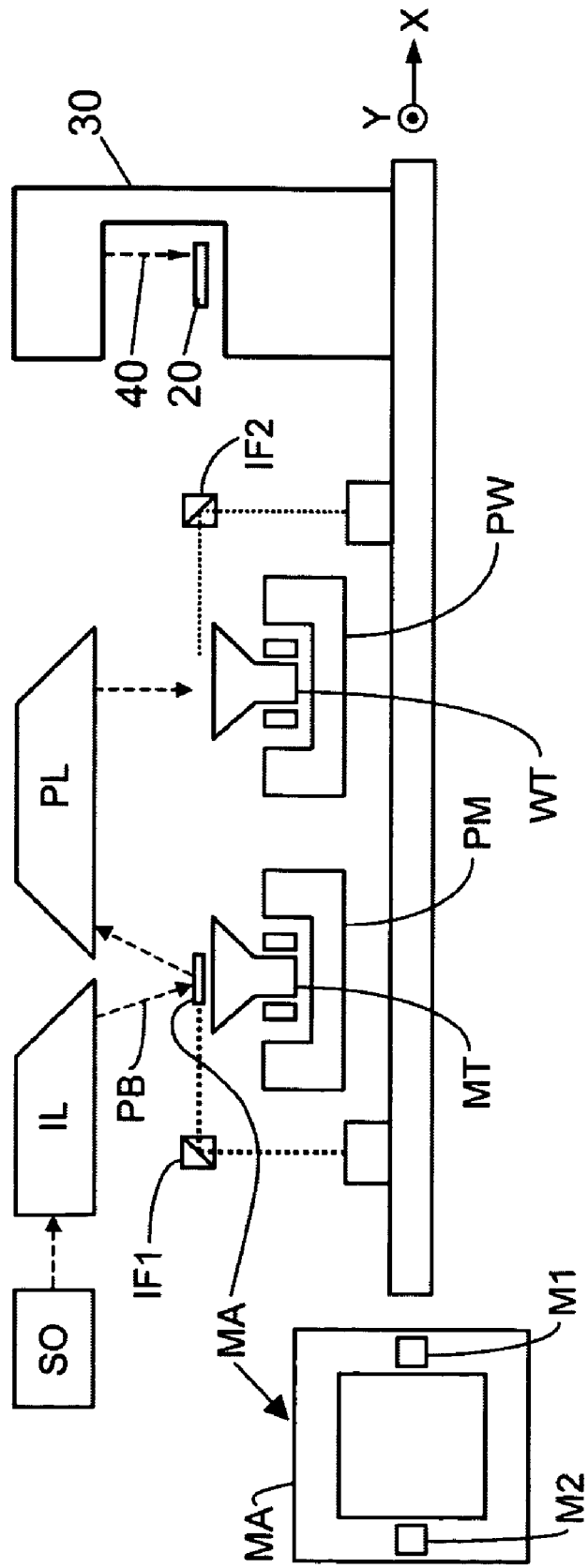
FIG. 7 illustrates lithographic apparatus according to one embodiment of the invention.

One convenient way of carrying out the pre-exposure with the tilted intensity beam is to use a specially adapted Optical Edge Bead Removal (OEBR) system to provide the required tilted intensity beam to be applied to the edge region of the wafer. OEBR systems are known and are readily available in the marketplace (see, for example, Ushio's Model PE-250 R2 OEBR system). As shown in FIG. 6, an OEBR system can be used to generate a block 10 of light which is directed on to a portion of an annular edge region 15 of the wafer 20, this being the region in which the edge bead of the resist is normally removed using the OEBR tool. In this embodiment the edge bead has already been removed from the wafer (but in some cases it may be possible to perform edge bead removal at the same time, or at least substantially the same time, as this pre-exposure step). The block 10 of light has a tilted intensity profile in which the intensity increases towards the edge of the wafer. This is achieved by modifying the normal uniform intensity beam of light obtained from a standard OEBR tool by inserting an optical filter into the tool, the filter being designed to shape the intensity profile of the block of light 10 in the desired manner, i.e., give a tilted intensity profile. A rotationally symmetric dose of the tilted beam is applied to the wafer by simply rotating the wafer 360 degrees about its centre, without moving the position of the block of light 10. This whole pre-exposure step could take place at pre-alignment of the wafer, before it moves on to an exposure chuck (i.e., the substrate table WT in the embodiment of FIG. 2) where it will be exposed to the patterned projected beam (i.e., the aerial image such as that of FIG. 3(a)). FIG. 7 illustrates such an arrangement in which an OEBR tool 30 is incorporated into the apparatus of FIG. 2 and positioned to carry out the desired pre-exposure of the wafer 20 (by applying a beam of light 40 to the desired area of the wafer) before it moves on to the substrate table WT in the apparatus of FIG. 2, where it will be exposed to the patterned projected beam. (Like numerals are used to reference like parts in FIGS. 2 and 7.) The pre-exposed wafer is in this case automatically moved on from the OEBR system 30 to the substrate table WT (for example by a robotic arm), but alternatively the second positioning means PW of the apparatus of FIG. 2 may itself be designed to position the substrate table temporarily into the OEBR system to allow the wafer to be pre-exposed thereby and may then move on automatically to the position shown in FIG. 2 in which the wafer W is exposed to the patterned projection beam. Alternatively, in a dual stage lithographic apparatus, for example, then one wafer can be pre-exposed with the compensating beam of radiation while another wafer (having already undergone such a pre-exposure step) is being exposed with the patterned projection beam.

Since extra light/energy has been added to the edge region 15 of the wafer, this edge region needs a lower energy at the final exposure in order to form etched lines of the desired linewidth (i.e., lower energy than would be required to form lines of this width if the pre-exposure step had not been carried out). Moreover, by increasing the intensity of the added extra light towards the edge of the wafer this compensates in a complementary manner for the gradually decreasing linewidth which would otherwise be seen in a direction extending radially outwards towards the edge of the wafer. This technique enables better CD uniformity to be achieved across the wafer, after the etch stage. For chip manufacturers, this results in better yield and more profitable chips.

While specific embodiments of the invention have been described above, it will be appreciated that the invention may be practiced otherwise than as described. The description is not intended to limit the invention.

For example, the embodiment of the invention discussed above and illustrated with reference to FIGS. 4 and 5 uses negative resist on the wafer. It will be appreciated that in other embodiments positive resist may be used, in which case the intensity profile of the compensating beam would be the reverse of that used for negative resist embodiments e.g., where a tilted intensity profile in which the intensity increases towards edge of the wafer would be used for negative resist, an oppositely tilted intensity profile would be used with positive resist, i.e., the intensity would decrease towards the edge of the wafer.

Also, although in the above-described embodiment an OEBR system is incorporated into the lithographic apparatus of FIG. 2 so that the wafer is automatically (e.g., by robotic arms, etc.) transferred from the OEBR system 30 to the substrate table WT where it will be exposed to the patterned projection beam, the OEBR system could alternatively be provided entirely separately to the rest of the apparatus. However, in this case the pre-exposed wafer would have to be manually transferred from the OEBR system to the lithographic system.

Furthermore, although OEBR systems are particularly well suited for carrying out the exposure of the annular edge region 15 of the wafer with the desired compensating beam 10, other illumination systems could equally be used for carrying out this pre-exposure step. For example a laser system could be used to generate the desired beam of compensating radiation, the system being configured to focus the laser beam on to the desired portion of the wafer to be pre-exposed. It is envisaged that, if desired, the illumination system for providing the patterned projection beam could be modified to also enable it to provide the compensating beam of radiation (although not simultaneously with the patterned projection beam), for example by incorporating into the apparatus of FIG. 2 a filter or other beam shaping device for temporarily modifying the intensity profile of a beam of radiation from the radiation source SO of the apparatus, so as to provide the desired compensating beam and direct it on to the desired area of the wafer. In this embodiment it will be appreciated it would be necessary to remove the patterning mask (and perhaps also some of the components of the mask projection system) out of the apparatus, or at least out of the path of the radiation beam, while the pre-exposure step with the compensating beam is carried out.

Additionally, although in the above described embodiment the compensating beam is deigned to compensate, or at least substantially compensate, for variation in the CD profile (which would otherwise occur) in the edge region of the wafer, the pre-exposure technique can equally be used to correct for other types of variation which may occur in devices formed across the wafer. For example, in some case the CD profile across the wafer may be flat, or relatively flat, but one or more device performance characteristics may be found to vary in similar devices formed in different areas of the wafer. In this case, the intensity profile of the compensating beam (in cross-section), and the area(s) of the wafer which are pre-exposed to the compensating beam, may be designed to compensate for the expected variation in device performance characteristic(s) across the wafer or across a particular area of the wafer. This could, for example, be done by using pre-exposure with the compensating beam in order to modify the CD profile across the wafer, or the particular area of the wafer, so as to substantially compensate for the variation in device performance characteristics (which would otherwise occur if pre-exposure with the compensating beam was not carried out).

Figure 8:
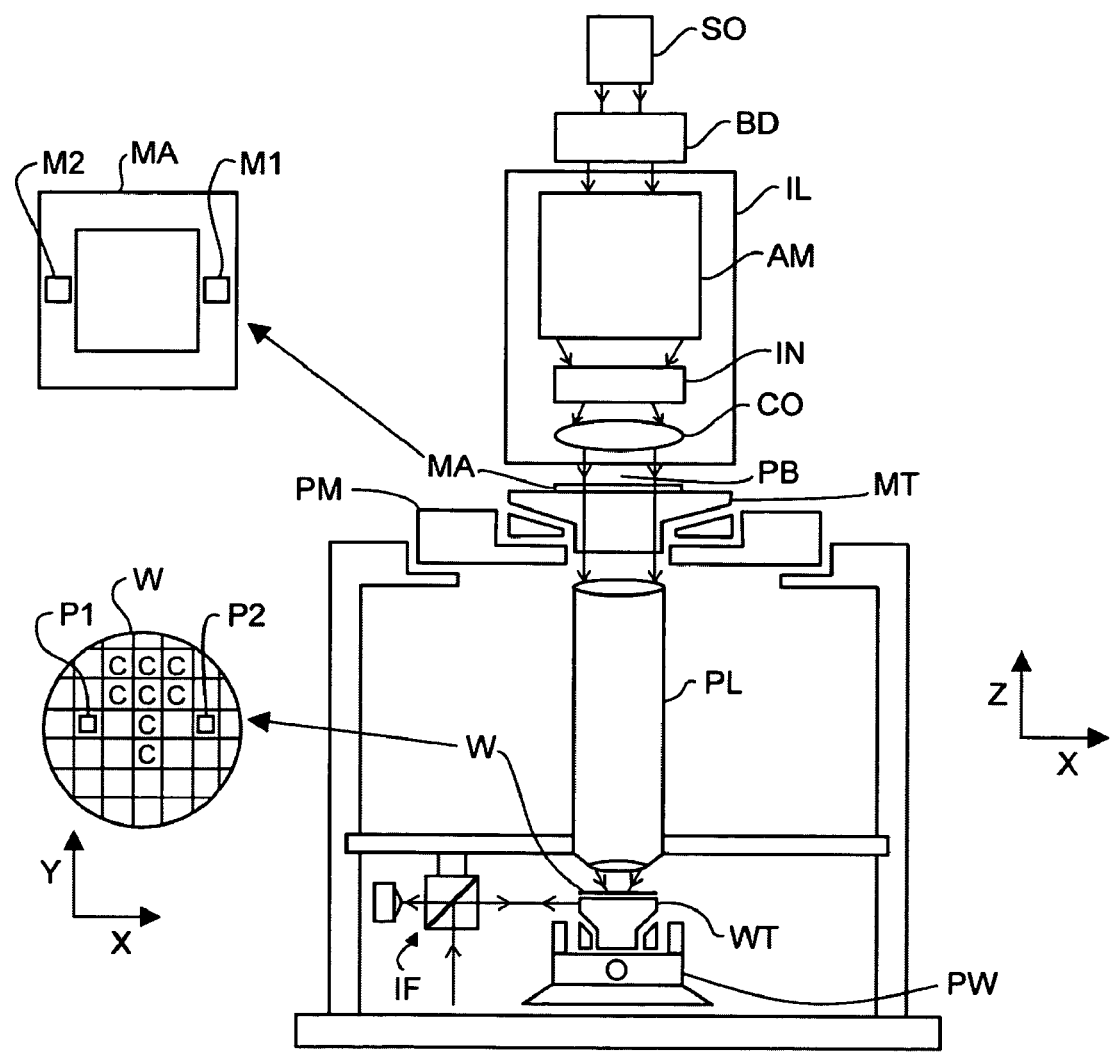
FIG. 8 depicts a typical lithographic apparatus of the transmissive type.

Finally, although FIGS. 2 and 7 show lithographic apparatus of the reflective type (e.g., employing a reflective mask or a programmable mirror array), the apparatus of the invention may alternatively be of the transmissive type (e.g., employing a transmissive mask). FIG. 8 schematically depicts a typical lithographic apparatus of the transmissive type to which the present invention may be applied. Like parts in FIGS. 2 and 8 are referenced by like reference letters. The apparatus of FIG. 8 functions in a similar manner to the apparatus of FIG. 2, the main differences being that in the transmissive system of FIG. 8: the projection system PL uses a refractive projection lens (rather than a reflective lens); in addition to adjusting means AM the illuminator IL generally comprises various other components, such as an integrator IN and a condenser CO; the projection beam PB traverses the mask MA (rather than being reflected by it); and the mask MA is accurately positioned with respect to the path of the beam PB using the first positioning means PM and another position sensor which is not explicitly depicted in FIG. 8. Also, if the radiation source SO and the lithographic apparatus are separate entities, for example where the source is an excimer laser, the radiation beam is passed from the source SO to the illuminator IL with the aid of a beam delivery system BD comprising for example suitable directing mirrors and/or a beam expander. It will be appreciated that in a similar manner to the embodiment described with reference to FIG. 7, an OEBR tool 30 may be incorporated into the apparatus of FIG. 8, or used in conjunction therewith, to carry out the desired pre-exposure of the wafer 20 (by applying a beam of light 40 to the desired area of the wafer) before the wafer moves on to the substrate table WT in the apparatus of FIG. 8 (where it is exposed with the patterned projection beam).

What is claimed is:

1. Lithographic apparatus comprising:
   a first illumination system for providing a projection beam of radiation;
   a support structure for supporting a patterning device, the patterning device serving to impart the projection beam with a pattern in its cross-section;
   a substrate table for holding a substrate;
   a projection system for projecting the patterned beam onto a target portion of the substrate; and
   a second illumination system for providing a compensating beam of radiation to a predetermined area on the substrate, an intensity of the compensating beam being varied across said predetermined area.

2. The apparatus of claim 1, wherein the intensity of the compensating beam varies substantially linearly across said predetermined area.

3. The apparatus of claim 1, wherein the predetermined area is an edge region of the substrate and the intensity of the compensating beam increases towards the edge of the substrate.

4. The apparatus of claim 1, wherein the predetermined area is an edge region of the substrate and the intensity of the compensating beam decreases towards the edge of the substrate.

5. The apparatus of claim 3, wherein the substrate is substantially circular in shape and the intensity of the compensating beam preferably varies substantially linearly in a radial direction in relation to the substrate so as to increase towards the edge of the substrate.

6. The apparatus of claim 4, wherein the substrate is substantially circular in shape and the intensity of the compensating beam preferably varies substantially linearly in a radial direction in relation to the substrate so as to decrease towards the edge of the substrate.

7. The apparatus of claim 1, wherein the substrate table is formed and arranged to rotate the substrate during exposure with the compensating beam so that an annular area of the substrate is exposed with the compensating beam.

8. The apparatus of claim 1, wherein a second substrate table is provided for holding the substrate during exposure of said predetermined area of the substrate with said beam of compensating radiation.

9. The apparatus of claim 8, wherein the second illumination system and the second substrate table are provided in a separate portion of the apparatus to the first illumination system, the support structure, and the projection system.

10. The apparatus of claim 1, wherein the second illumination system is provided in the form of an Optical Edge Bead Removal (OEBR) system adapted to provide said compensating beam of radiation.

11. A device manufacturing method comprising:
    providing a projection beam of radiation;
    patterning the projection beam with a pattern in its cross-section; and
    projecting the patterned beam of radiation onto a target portion of a substrate,
    wherein before the patterned beam of radiation is projected on to the target portion of the substrate, a beam of compensating radiation is irradiated on to a predetermined area of the substrate, the beam of compensating radiation having an intensity which varies across said predetermined area.

12. The device manufacturing method of claim 11, wherein the intensity of the beam of compensating radiation varies across said predetermined area so as to substantially correct for variation in a predetermined device performance characteristic which would otherwise occur in a plurality of devices to be formed in said predetermined area of the substrate.

13. The device manufacturing method of claim 11, wherein the intensity of the beam of compensating radiation varies across said predetermined area so as to substantially correct for variation in CD profile which would otherwise occur across said predetermined area of the substrate.

14. The device manufacturing method of claim 11, wherein the beam of compensating radiation has an intensity which varies substantially linearly across said predetermined area.

15. The device manufacturing method of claim 11, wherein the predetermined area is an edge portion of the substrate.

16. The device manufacturing method of claim 11, wherein the substrate is substantially circular in shape and the intensity of the compensating beam increases in a radial direction relative to the substrate so as to increase towards the edge of the substrate.

17. The device manufacturing method of claim 11, wherein the substrate is substantially circular in shape and the intensity of the compensating beam decreases in a radial direction relative to the substrate so as to decrease towards the edge of the substrate.

18. The device manufacturing method of claim 11, wherein the method further includes rotating the substrate during irradiation with the compensating beam so that an annular edge region of the substrate is irradiated with the compensating beam.

19. The device manufacturing method of claim 11, wherein the beam of compensating radiation is provided by an Optical Edge Bead Removal (OEBR) system adapted to provide a beam of radiation having a varying intensity in cross-section.

20. A device manufactured by the lithographic apparatus of claim 1.

21. A device manufactured according to the device manufacturing method of claim 11.

22. The apparatus of claim 1, wherein a latent image formed on the substrate by the projection beam is superposed to a latent image formed on the substrate by the compensating beam to form an image on the substrate in which critical dimension non-uniformities are substantially reduced.

* * * * *